United States Patent
Lin et al.

(10) Patent No.: US 10,468,100 B1
(45) Date of Patent: Nov. 5, 2019

(54) DETECTING METHOD FOR A RESISTIVE RANDOM ACCESS MEMORY CELL

(71) Applicant: Winbond Electronics Corp., Taichung (TW)

(72) Inventors: Lih-Wei Lin, Taichung (TW); Yu-An Chen, Taichung (TW); Guan-Yi Li, Taichung (TW); Hsuan-Pao Tseng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/046,966

(22) Filed: Jul. 26, 2018

(51) Int. Cl.
G11C 13/00 (2006.01)
H01L 45/00 (2006.01)

(52) U.S. Cl.
CPC ...... *G11C 13/0069* (2013.01); *H01L 45/1253* (2013.01); *G11C 2013/0083* (2013.01)

(58) Field of Classification Search
CPC .............. G11C 13/0069; G11C 2013/0083
USPC ........................................................ 365/148
See application file for complete search history.

(56) References Cited

U.S. PATENT DOCUMENTS

| | | | | |
|---|---|---|---|---|
| 8,867,259 B2 * | 10/2014 | Kawai | ............... | G11C 13/0007 365/148 |
| 8,947,905 B2 * | 2/2015 | Chang | ............... | G11C 11/5685 365/148 |
| 9,064,573 B2 * | 6/2015 | Kawai | ............... | G11C 13/0069 |
| 9,202,565 B2 * | 12/2015 | Kawai | ............... | G11C 13/0007 |
| 9,378,817 B2 | 6/2016 | Kawai et al. | | |
| 2014/0078811 A1 * | 3/2014 | Kawai | ............... | G11C 13/00 365/148 |

* cited by examiner

*Primary Examiner* — Son L Mai
(74) *Attorney, Agent, or Firm* — JCIPRNET

(57) ABSTRACT

The disclosure provides a detecting method for a resistive random access memory (RRAM) cell. The method includes: retrieving an RRAM cell and measuring a cell current of the RRAM cell; when a current value of the cell current is higher than a first threshold, performing at least one of a plurality of reset operations and a set operation to the RRAM cell and determining whether a resistance state of the RRAM cell has been switched after experiencing the at least one of the reset operations and the set operation. If no, a recovery operation is performed to the RRAM cell to recover the RRAM cell; if yes, the RRAM is determined to be in a healthy state.

10 Claims, 7 Drawing Sheets

DETECTING METHOD FOR A RESISTIVE RANDOM ACCESS MEMORY CELL

BACKGROUND OF THE INVENTION

Field of the Invention

The present disclosure relates to a memory detection method, and more particularly to a detection method of a resistive random access memory (RRAM).

Description of Related Art

RRAM is a non-volatile memory in which RRAM cells each includes a top electrode plate, a bottom electrode plate, and a resistive switching layer sandwiched between the top and the bottom electrode plates. The resistive switching layer may be applied with a suitable voltage on the top electrode plate to perform a forming operation on the memory cell, and a conductive path of the resistive switching layer may be formed in the resistive switching layer (commonly referred to as a conductive filament, (CF)). Once the conductive filament is formed, an appropriate voltage can be applied on the top electrode plate to perform a reset operation (i.e., the conductive filament is broken or ruptured, such that a high resistance state (HRS) occurs on the RRAM cell). Afterwards, a set operation can be performed on the RRAM cell by applying a suitable voltage on the top electrode plate (i.e., the conductive filament is reformed, such that a low resistance state (LRS) occurs on the RRAM cell). LRS and HRS can be used to indicate digital signals "0" or "1", and hence related memory functions can be provided.

However, in prior arts, if a resistance state of a memory cell in the RRAM is repeatedly switched between the LRS and the HRS by continuously performing reset operations and set operations on the memory cell in the RRAM, it is very likely that the memory cell resistance state may stuck at the LRS. That is, the resistance state of the memory cell will constantly be in the LRS and cannot be normally switched to the HRS by subsequent reset operations.

Therefore, for a person skilled in the art, how to provide a method for finding a memory cell about to be stuck at the LRS, so as to avoid the occurrence of the above situation, is indeed an important issue.

SUMMARY OF THE INVENTION

In view of this, embodiments of the present disclosure provide a method for detecting an RRAM cell, which can find the RRAM cell about to be stuck at the LRS in advance and perform a recovery operation accordingly.

The present disclosure provides a method for detecting the RRAM cell, including: retrieving a resistive random access memory cell, and measuring a cell current of the resistive random access memory cell; when a current value of the cell current is greater than a first threshold, performing at least one of a plurality of reset operations and a set operation on the resistive random access memory cell; determining whether a resistance state of the resistive random access memory cell experiencing the foregoing is switched accordingly after at least one of the reset operations and the set operation. If not, a recovery operation is performed on the resistive random access memory cell to restore the resistive random access memory cell; if yes, the resistive random access memory cell is determined to be in a healthy state.

Based on the above, the detection method of the RRAM cell proposed by an embodiment of the present disclosure may determine a test operation (for example, several reset operations and/or set operation, etc.) to be performed on the RRAM cell according to the current value of the RRAM cell, and observe whether the current value of the RRAM cell can be significantly changed correspondingly. If not, it means that the RRAM cell is about to be stuck at the LRS, so a recovery operation can be performed accordingly to restore the conductive filament to avoid RRAM cell losing the ability to memorize data due to being stuck at the LRS.

To make the aforementioned features and advantages more comprehensible, several embodiments accompanied with drawings are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
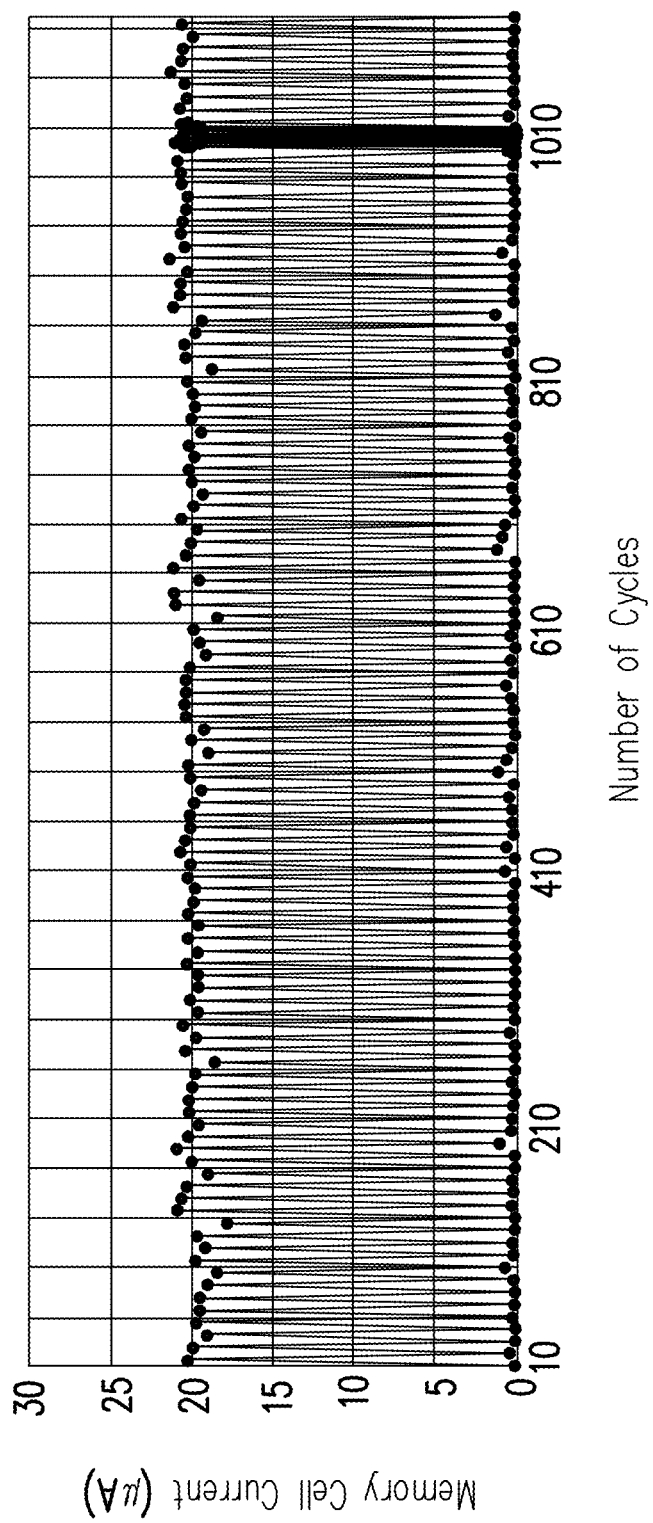
FIG. 1 is a schematic diagram of an RRAM cell current that is not stuck at the LRS according to an embodiment of the disclosure.

As shown in FIG. 1, if a cell current of an RRAM cell can still be switched normally between large currents (e.g., 20 μA) and low currents (e.g., 0 μA) after experiencing a plurality of cycles (one cycle represents one reset operation and one set operation), it means that a resistance state of the RRAM cell can be switched to the corresponding resistance state in response to the reset operations and the set operations. That is, the RRAM cell does not appear to be stuck at the LRS (which in this case may be referred to as the RRAM cell is in a healthy state).

Figure 2:
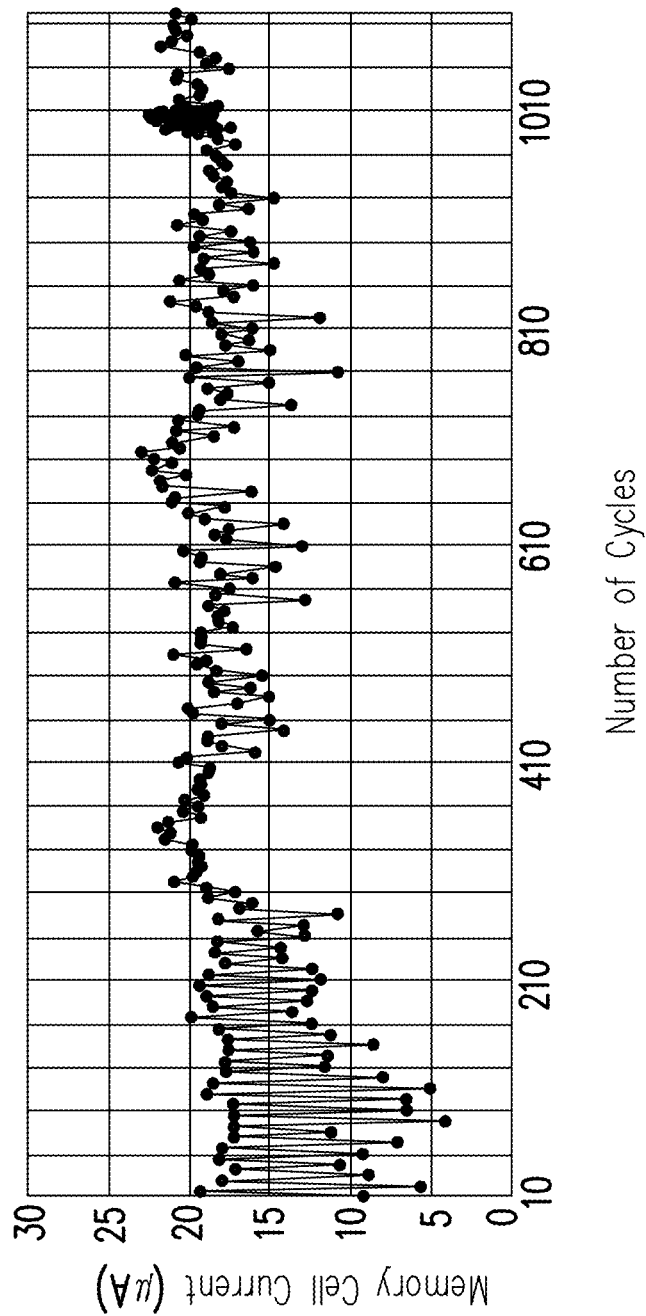
FIG. 2 is a schematic diagram of the RRAM cell current that is stuck at the LRS according to an embodiment of the disclosure.

Referring to FIG. 2, if a cell current of the RRAM cell can only constantly exhibit large currents (e.g., higher than 20 μA) after experiencing many cycles, also it cannot be changed to small currents (e.g., less than 10 μA) in response to the reset operations, then it means that the resistance state of the RRAM cell can no longer be switched to the HRS in response to the reset operations. That is, the RRAM cell appear to be already stuck at the LRS.

Figure 3:
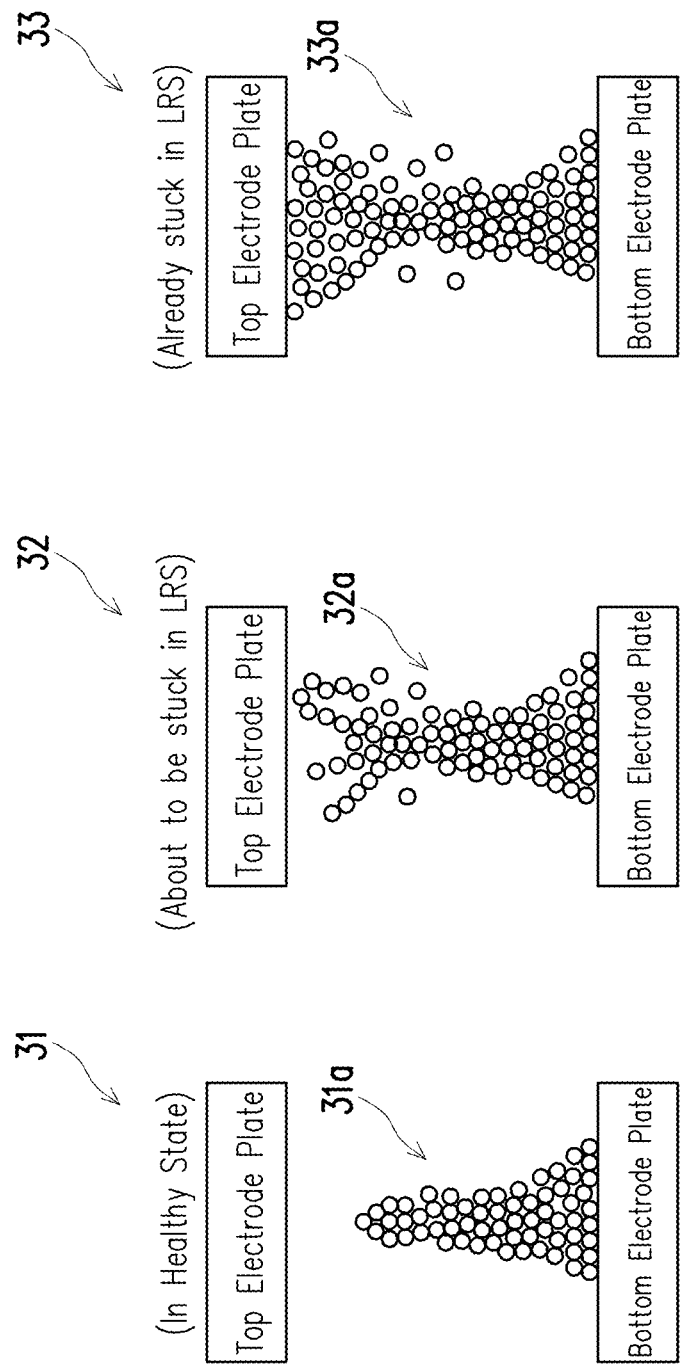
FIG. 3 is a schematic of three aspects of RRAM cells after experiencing the reset operation.

Referring to FIG. 3, it is assumed that an RRAM cell 31 is in the healthy state, an RRAM cell 32 is to be stuck at the LRS, and an RRAM cell 33 is already stuck at the LRS.

As shown in FIG. 3, in the RRAM cell 31, the structure of a conductive filament 31a is relatively tight and the gap between the conductive filament 31a and the top electrode plate is large, so that the resistance state of the RRAM cell 31 can be made to be the HRS. Also, after the RRAM cell 31 experiences a set operation, the conductive filament 31a should be correspondingly changed to a state of being connected to the top electrode plate, thereby normally switching the RRAM cell 31 to the LRS.

However, in the RRAM cell 32, although a conductive filament 32a is not connected to the top electrode plate, which makes the RRAM cell 32 appear to be the HRS, since the structure of the conductive filament 32a is loose and a gap between the conductive filament 32a and the top electrode plate is small, so the RRAM cell 32 may be stuck at the LRS after experiencing several subsequent cycles.

In the RRAM cell 33, a conductive filament 33a has been normally connected to a top electrode plate, and may not be changed to the state of, for example, the conductive filament 31a or 32a in response to the reset operations. In other words, the resistance state of the RRAM cell 33 cannot be switched to the HRS in response to the reset operations, and it is constantly stuck at the LRS. Moreover, after the RRAM cell 33 experiences the reset operation, the cell current may be increased instead of decreased, thereby causing a problem of complementary switching (CS). In this case, the RRAM cell 33 will lose the ability to memorize data due to the inability to switch between the HRS and the LRS, and will be treated as an invalid bit.

In view of this, an embodiment of the present disclosure proposes a detection method for an RRAM, which can find an RRAM cell about to be stuck at the LRS in advance and perform a recovery operation accordingly, so as to avoid the RRAM cell losing ability to memorize data due to being stuck at the LRS. Detailed explanation will be provided as below.

Figure 4A:
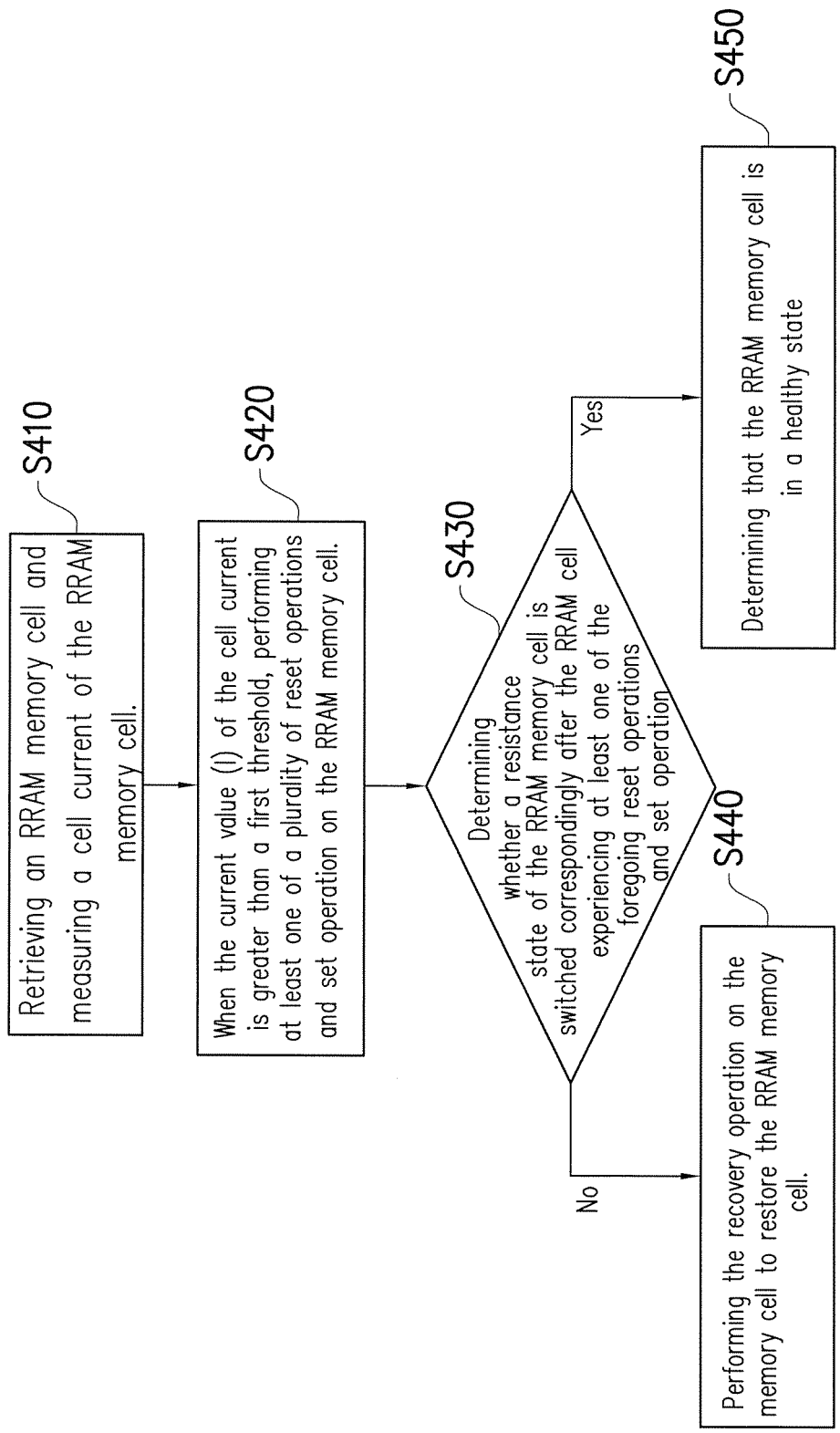
FIG. 4A is a flowchart of a detecting method for the RRAM according to an embodiment of the present disclosure.

In an embodiment, the method shown in FIG. 4A may be carried out every time before a set operation and/or a reset operation is performed on an RRAM cell, so as to determine whether the RRAM cell can normally switch the resistance state thereof, but the disclosure is not limited thereto.

As shown in FIG. 4A, in step S410, the RRAM cell can be retrieved, and the cell current of the RRAM cell is measured; in step S420, when the current value (indicated by I) of the cell current is greater than a first threshold (referred to as T1), at least one of a plurality of reset operations and set operation are performed on the RRAM cell; in step S430, it may be determined whether the resistance state of the RRAM cell is switched accordingly may be determined after the RRAM cell experiencing the at least one of the plurality of reset operations and set operation. If not, a recovery operation may be performed on the RRAM cell in step S440 to restore the RRAM cell. Otherwise, the RRAM cell may be determined to be in the healthy state in step S450.

In an embodiment, the first threshold (T1) is, for example, a reference current value that can be used to determine whether a RRAM cell is in the HRS, which may be set by the designer according to experience and manufacturing capability, and the value thereof is usually the smaller the better. Specifically, when the current value (I) of the cell current is less than the first threshold (T1), it means that the RRAM cell is exactly in the HRS, which is, the possibility that the RRAM cell will be stuck at LRS is not high.

However, in step S420, when the current value (I) of the cell current is determined to be greater than T1, it means that the RRAM memory cell is more likely to be stuck in the LRS in the future. Therefore, several subsequent test operations, such as reset operations and/or set operation, may be performed on the RRAM cell, and whether the resistance state of the RRAM cell is switched correspondingly can be observed. If the resistance state of the RRAM cell can be apparently switched between the HRS and the LRS, it means that the RRAM cell is in the healthy state. On the contrary, if the resistance state of the RRAM cell cannot be switched apparently in the above-described test operations, the conductive filament of the RRAM memory cell may have been in the form of the conductive filament 32a as shown in FIG. 3 and will soon be stuck at the LRS. In this case, the embodiment of the present disclosure may perform a recovery operation on the RRAM cell to restore the conductive filaments in the RRAM cell.

Figure 4B:
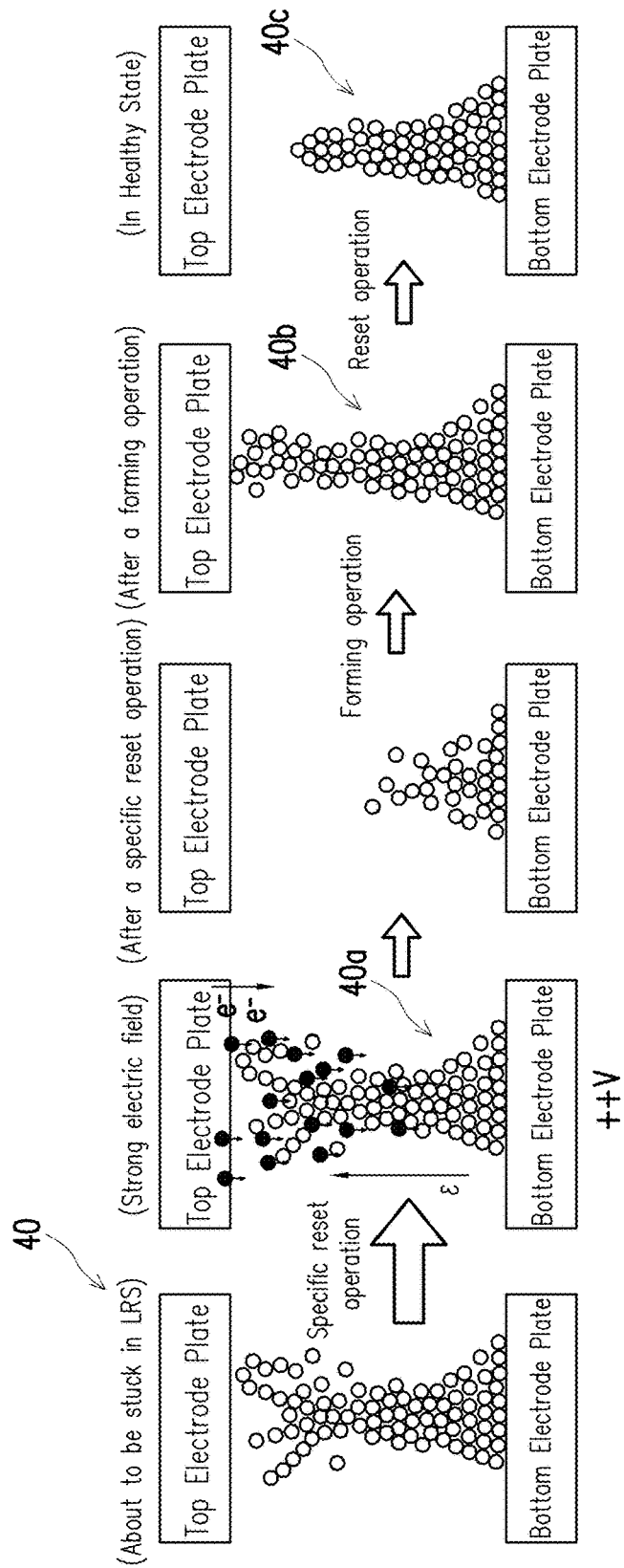
FIG. 4B is a schematic diagram of a recovery operation of an embodiment of the present disclosure.

Referring to FIG. 4B, in this embodiment, the recovery operations may include a specific reset operation, a forming operation, and another reset operation in sequence. When the RRAM cell 40 is determined about to be stuck at the LRS, a specific reset operation may be performed on the RRAM cell 40. Different from the normal reset operations, the specific reset operation in this embodiment uses a higher gate voltage (e.g., higher than 5V), a higher source line voltage (e.g., higher than 5V), and a longer pulse width (e.g., longer than 5 μsec) applied to the bottom electrode plate of the RRAM cell 40 to generate a stronger electric field between the top electrode plate and the bottom electrode plate. In this case, a large number of electrons (represented by e⁻) will be accelerated downward and bring back oxygen ions of the top electrode plate to fill in the oxygen vacancies (illustrated as circles) in the conductive filaments 40a of the RRAM cell 40 therefore forming electro neutrality, so that only a part of the oxygen vacancies closer to the bottom electrode plate remains in the conductive filament 40a. Afterwards, a forming operation may be further performed on the RRAM cell 40 so that the RRAM cell 40 forms a better shaped conductive filament 40b. Next, another reset operation may be performed on the RRAM cell 40 (which may be performed based on a general reset voltage) to change the conductive filament 40b to the aspect of the illustrated conductive filament 40c (which is similar to conductive filament 31a in FIG. 3). As such, the RRAM cell 40 can healthily stay in the HRS and can be used again to provide memory functionality.

In other words, after the RRAM cell 40 experiences the recovery operation described above, the host thereof can perform an actual set operation or an actual reset operation on the RRAM cell 40 to change the resistance state of the RRAM cell 40 according to a relevant data writing request, as to achieve the function of memorizing digital signals such as "0" or "1".

In different embodiments, the embodiments of the present disclosure may be define with several intervals based on a first threshold (T1), a second threshold (referred to as T2), a third threshold (referred to as T3) and a fourth threshold (referred to as T4) (wherein T1, T2, T3, and T4 are increasingly arranged, i.e., T4>T3>T2>T1), and then the corresponding content of the test operation to perform on the RRAM cells can be decided based on the interval where the current value (I) of the cell current is.

Please refer to FIG. 5, in this embodiment, steps S420 and S430 in FIG. 4A may be broken down to steps S51a, S51b, S52, S53a, S53b, S54, and S55 in FIG. 5, and the details are described below.

First, when the current value (I) of the cell current is between the first threshold (T1) and the second threshold (T2), it means that the resistance value of the RRAM cell may be high, and thus the set operation can be performed on the RRAM cell in step S51a in an attempt to lower the resistance of the RRAM cell. After that, it may be determined in step S51b whether the current value (I) of the cell current is changed correspondingly to be higher than the third threshold (T3). If not (i.e., I<T3), it means that the resistance state of the RRAM cell is not switched to a sufficiently low state in response to the set operation, thus step S54 can be subsequently performed to determine that the resistance state of the RRAM cell is not switched correspondingly, and step S440 is performed to perform a recovery operation on the RRAM cell.

On the other hand, if I>T3, it means that the resistance state of the RRAM cell may have been switched to a sufficiently low state in response to the set operation, therefore, step S52 may be subsequently performed to further test the RRAM cell.

In step S52, a plurality of reset operations may be performed on the RRAM cell, and whether the current value (I) has been switched correspondingly to be lower than the first threshold (T1) after experiencing one of the aforementioned reset operations may be determined. In an embodiment, the reset operation can be continuously performed for n times (n is, for example, a positive integer not greater than 8) on the RRAM cell, and after each operation, whether the current value (I) is lower than the first threshold (T1) may be determined. That is, whether the RRAM cell has been switched to the HRS in response to the reset operation may be determined.

If a current value (I) is measured to be lower than a first threshold (T1) after $k^{th}$ reset operations (k is a positive integer not greater than n), which represents that an RRAM cell has been switched to the HRS, and hence step S55 may be subsequently performed to determine that the resistance state of the RRAM cell has been switched correspondingly, and step S450 is performed to determine that the RRAM cell is in the healthy state. Under this situation, the RRAM cell can be used normally to memorize digital signals such as "0" or "1" and further provide memory function.

In addition, if the measured current value (I) is not lower than the first threshold (T1) after the $n^{th}$ reset operation, which means that the RRAM cell cannot be switched to the HRS, step S54 may be performed to determine that the resistance state of the RRAM cell is not switched correspondingly, and step S440 may be performed to perform a recovery operation on the RRAM cell.

Figure 5:
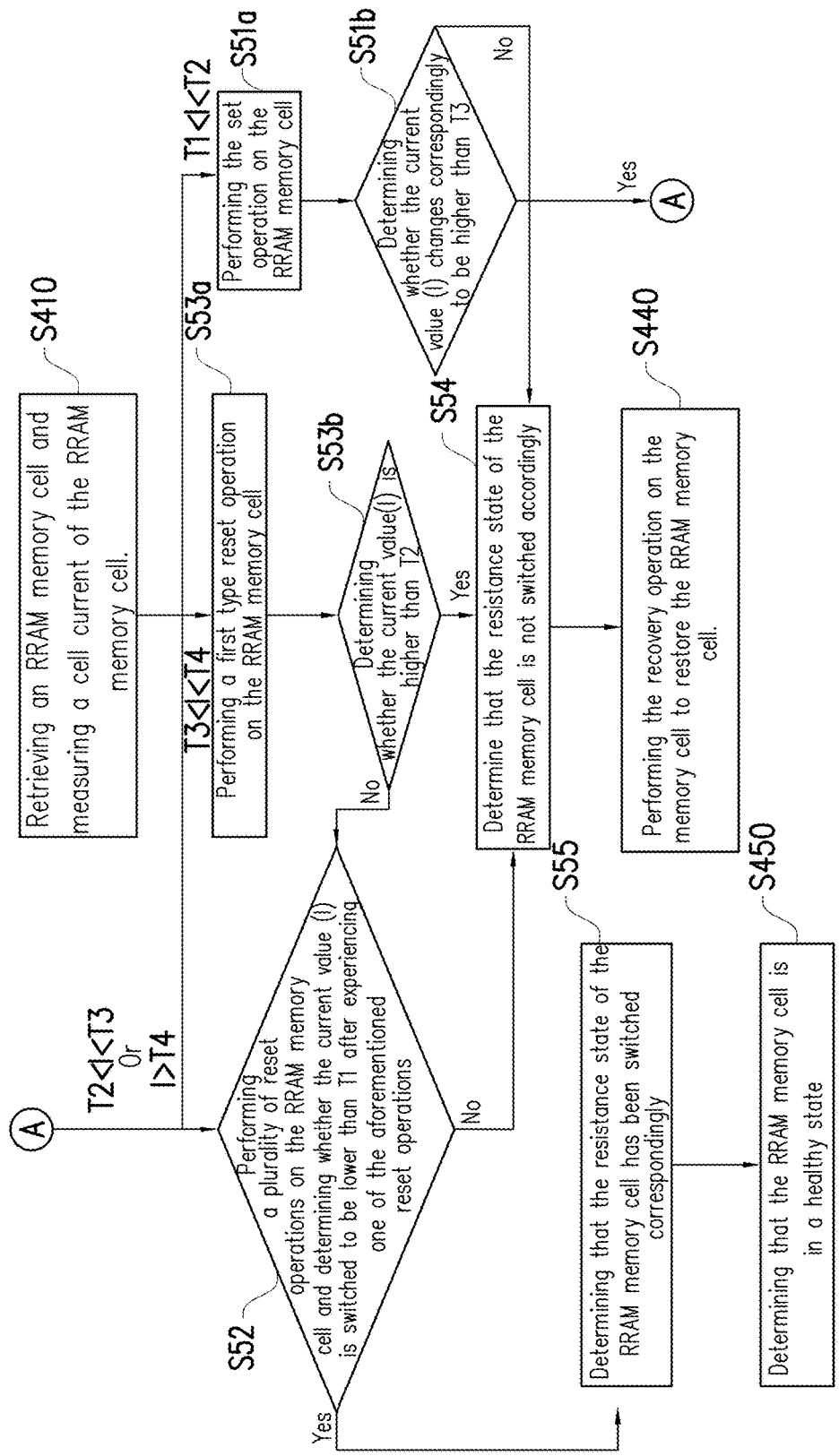
FIG. 5 is a flowchart of the detecting method for the RRAM according to FIG. 4A.

In addition, as shown in FIG. 5, when the current value (I) of the cell current is between the second threshold (T2) and the third threshold (T3), the resistance state of the RRAM cell is not high nor low, so by performing step S52 the RRAM cell can be further tested.

In addition, when the current value (I) of the cell current is greater than the fourth threshold (T4), it means that the resistance state of the RRAM cell may already be at the LRS. At this time, the RRAM cell can still be further tested by performing step S52. For details of the step S52, reference may be made to the teachings of the foregoing embodiments, and details would not described herein again.

As taught in the foregoing embodiment, if the determining result in step S52 is YES, it may be determined in step S55 that the resistance state of the RRAM cell has been switched correspondingly, and step S450 is performed to determine that the RRAM cell is in the healthy state. On the contrary, if the determining result in step S52 is NO, it can be determined in step S54 that the resistance state of the RRAM cell has not been switched correspondingly, and step S440 is carried out to perform a recovery operation on the RRAM cell.

In FIG. 5, when the current value (I) of the cell current is between the third threshold (T3) and the fourth threshold (T4), it means that the resistance state of the RRAM cell may be quite close to the LRS. Therefore, step S53a can be carried out correspondingly to perform a first type reset operation on the RRAM cell, thereby checking whether the RRAM cell is in an "under reset" state. In this embodiment, the foregoing first type reset operation may be referred to as a gentle reset operation, which may use a reset voltage slightly lower than a no nal reset operation (or may be referred to as a second type reset operation, thereby distinguishing the reset voltage of the first type reset operation) to reset the RRAM cells.

Next, in step S53b, whether the current value (I) of the cell current is higher than the second threshold (T2) can be determined. If so, it represents that the current value (I) of the cell current is not significantly reduced, that is, the resistance of the RRAM cell is not significantly increased. Therefore, it can be determined in step S54 that the resistance state of the RRAM cell is not switched correspondingly, and step S440 is carried out to perform the recovery operation on the RRAM cell.

In addition, if it is determined in step S53b that the current value (I) of the cell current is smaller than the second threshold (T2), it represents that the current value (I) of the cell current is significantly reduced. In other words, the resistance of the RRAM cell has been significantly increased in response to the above-described gentle reset operation, so step S52 can be subsequently performed to further test the RRAM cell. For details of step S52, reference may be made to the teachings of the foregoing embodiments, and details would not described herein again.

As taught in the foregoing embodiment, if the determining result in step S52 is YES, it may be determined in step S55 that the resistance state of the RRAM cell has been switched correspondingly, and step S450 is performed to determine that the RRAM cell is in the healthy state. On the contrary, if the determining result in the step S52 is NO, it is determined in step S54 that the resistance state of the RRAM cell is not switched correspondingly, and step S440 is executed to perform the recovery operation on the RRAM cell.

It can be known from the above that the method proposed by the embodiment of the present disclosure can perform a corresponding test operation on the RRAM cell according to the interval where the current value (I) of the cell current is, thereby confirming whether the resistance state of the RRAM cell can be properly switched in response to reset operation and/or set operation. If not, the recovery operation can be carried out on the RRAM cell to restore the conductive filaments therein. In this way, the RRAM cell that is about to be stuck at the LRS can be found early, thereby avoiding the RRAM cell losing the ability to memory data due to being stuck at the LRS.

In other embodiments, those with ordinary skills in the art may also use more or less thresholds to define more or fewer intervals based on the above teachings, and depending on the interval in which the current value (I) is, steps S51a, S52, or S53a and subsequent steps can be performed on the RRAM cells.

Figure 6:
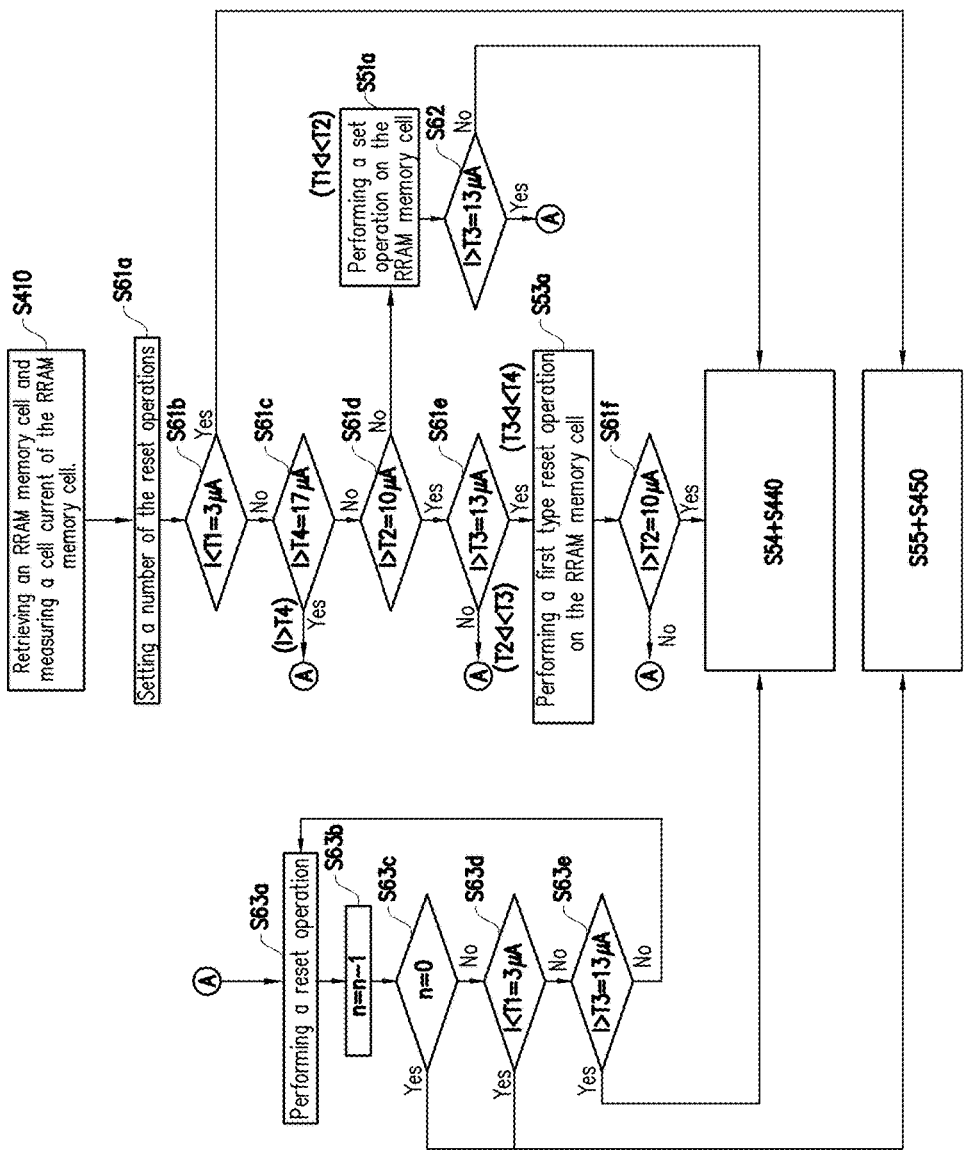
FIG. 6 is a flowchart of another detecting method for the RRAM according to FIG. 5.

Please refer to FIG. 6, which is a flowchart of another detecting method for the RRAM according to FIG. 5. In this embodiment, a first threshold (T1), a second threshold (T2), a third threshold (T3), and a fourth threshold (T4), which are increasingly arranged, are respectively substituted with specific values (for example, 3 µA, 10 µA, 13 and 17 µA) for a more specific explanation, but it is not intended to limit the possible embodiments of the present disclosure.

Roughly speaking, the method shown in FIG. 6 can determine the interval where the current value (I) is by steps S61b, S61c, S61d, and S61e, and correspondingly decide which test operation should be performed on the RRAM cell.

As shown in FIG. 6, after step S410 is performed to obtain the cell current of the RRAM cell, step S61a may be subsequently performed to set the number of the reset operations (i.e., the "n" taught in the foregoing embodiment). In different embodiments, designer can determine the value of n (e.g., 8) according to requirements. It should be noted that the value of n should not be too large, otherwise it may cause permanent damage to the RRAM cell after performing repeated test reset operations on the RRAM cell.

After determining the value of n, it is determined in step S61b whether the current value (I) of the cell current is smaller than T1 (i.e., 3 μA). If yes, it means that the RRAM cell is already in the HRS, and hence steps S55 and S450 can be sequentially performed. Related details may be referred to the teachings of the foregoing embodiments, which would not repeated herein.

If the current value (I) is not less than T1, step S61c may be subsequently performed to determine whether the current value (I) is greater than T4 (i.e., 17 μA). If so, it means that the resistance state of the RRAM cell may already be in the LRS. At this time, the RRAM cells can be further tested by performing steps S63a, S63b, S63c, S63d, and S63e.

In step S63a, a reset operation can be performed on the RRAM cell, and the value of n is decremented in step S63b. In step S63c, if the value of n has been decremented to 0 (i.e., the reset operations have been continuously performed on the RRAM cell for n times), steps S55 and S450 may be subsequently performed. On the other hand, if the value of n has not been decremented to 0, it can be determined in step S63d whether the current value (I) is less than T1 (i.e., 3 μA), and if so, the RRAM cell is already in the HRS, therefore step S55 and S450 can be subsequently performed.

Conversely, if it is determined in step S63d that the current value (I) is not less than T1 (i.e., 3 μA), it can be determined the whether the current value (I) is greater than T3 (i.e., 13 μA) in step S63e. If so, it means that the resistance value of the RRAM cell hardly increased in response to the reset operation in step S63a (i.e., the RRAM cell may be stuck at the LRS), so steps S54 and S440 may be subsequently performed to perform the recovery operation. Related details may be referred to the foregoing embodiment teachings.

On the other hand, if it is determined in step S63e that the current value (I) is not greater than T3 (i.e., 13 μA), it represents that the resistance of the RRAM cell may have been slightly increased, so that the process may return to step S63a to perform the reset operation again on the RRAM cell, and steps S63b to S63e can be carried out again to determine whether the resistance value of the RRAM cell has been significantly increased in response to the reset operation in step S63a.

In step S61c, if it is determined that the current value (I) is not greater than T4 (i.e., 17 μA), step S61d may be subsequently performed to determine whether the current value (I) is greater than T2 (i.e., 10 μA). If not, it means that the resistance of the RRAM cell may be too high, thus the set operation can be performed on the RRAM cell in step S51a in an attempt to reduce the resistance of the RRAM cell. Thereafter, it can be determined in step S62 that whether the current value (I) is correspondingly changed to be higher than T3 (i.e., 13 μA). If not (i.e., I<T3), it represents that the resistance state of the RRAM cell is not exactly switched to a sufficiently low state in response to the set operation, therefore steps S54 and S440 can be carried out to perform the recovery operation.

On the other hand, if it is determined in step S62 that the current value (I) is higher than T3 (i.e., 13 μA), steps S63a to S63e can be subsequently performed to further test the RRAM cells, and the details thereof will not be described again herein.

In step S61d, if it is determined that the current value (I) is higher than T2 (i.e., 10 μA), step S61e may be subsequently performed to determine whether the current value (I) is higher than T3 (i.e., 13 μA). If not, it represents that the resistance state of the RRAM cell is not high or low, so steps S63a to S63e can be subsequently performed to further test the RRAM cell, and details thereof will not be described herein. If so, it represents that the resistance state of the RRAM cell may be quite close to the LRS, so step S53a may be carried out correspondingly to perform the first type reset operation (i.e., the gentle reset operation) on the RRAM cell. Thereafter, it is determined in step S61f that whether the current value (I) is higher than T2 (i.e., 10 μA). If yes, it means that the current value (I) of the cell current is not significantly reduced, that is, the resistance of the RRAM cell is not significantly increased. Therefore, steps S54 and S440 can be subsequently performed to perform the recovery operation on the RRAM cells.

On the other hand, if it is determined in step S61f that the current value (I) is lower than T2 (i.e., 10 μA), it means the current value (I) of the cell current is significantly reduced. In other words, the resistance of the RRAM cell has been significantly increased in response to the above-described gentle reset operation, so that the RRAM cells can be further tested in steps S63a to S63e, and the details thereof will not be described herein.

Although the present disclosure has been disclosed in the above embodiments, it is not intended to limit the present disclosure, and those skilled in the art can make some modifications and refinements without departing from the spirit and scope of the present disclosure. The scope of the disclosure is defined by the scope of the appended claims.

What is claimed is:

1. A method for detecting determining a resistance state of a resistive random access memory cell, comprising:
    retrieving the resistive random access memory cell and measuring a cell current of the resistive random access memory cell; and
    performing at least one of a plurality of reset operations and a set operation on the resistive random access memory cell when a current value of the cell current is greater than a first threshold;
    determining whether the resistance state of the resistive random access memory cell is correspondingly switched after experiencing at least one of the reset operations and the set operation;
    if not, performing a recovery operation on the resistive random access memory cell to restore the resistive random access memory cell; and
    if yes, determining that the resistive random access memory cell is in a healthy state.

2. The method for determining the resistance state of the resistive random access memory cell according to claim 1, wherein after determining that the resistive random access memory cell is in the healthy state, the method further comprises:
    performing an actual set operation or an actual reset operation on the resistive random access memory cell according to a data write request.

3. The method for determining the resistance state of the resistive random access memory cell according to claim 1, wherein the step of performing the at least one of the reset operations and the set operation on the resistive random access memory cell, and determining whether the resistance state of the resistive random access memory cell is correspondingly switched after experiencing the at least one of the reset operations and the set operation comprises:
when the current value of the cell current is between the first threshold and a second threshold, performing the set operation on the resistive random access memory cell, and determining whether the current value of the cell current is correspondingly changed to be higher than a third threshold, wherein the third threshold is greater than the second threshold, and the second threshold is greater than the first threshold;
if not, determining that the resistance state of the resistive random access memory cell is not switched correspondingly.

4. The method for determining the resistance state of the resistive random access memory cell according to claim 3, wherein if the current value of the cell current has been correspondingly changed to be higher than the third threshold after the set operation, performing the reset operations on the resistive random access memory cell, and determining whether the current value of the cell current is correspondingly switched to be lower than the first threshold after experiencing one of the reset operations;
if yes, determining that the resistance state of the resistive random access memory cell has been switched correspondingly;
if not, determining that the resistance state of the resistive random access memory cell is not switched correspondingly.

5. The method for determining the resistance state of the resistive random access memory cell according to claim 1, wherein the step of performing the at least one of the reset operations and the set operation on the resistive random access memory cell and determining whether the resistance state of the resistive random access memory cell is correspondingly switched after experiencing the at least one of the reset operation and the set operation comprises:
when the current value of the cell current is between a second threshold and a third threshold, or greater than a fourth threshold, performing the reset operations on the resistive random access memory, and determining whether the current value of the cell current is correspondingly switched to be lower than the first threshold after experiencing one of the reset operations, wherein the fourth threshold is greater than the third threshold, the third threshold is greater than the second threshold, and the second threshold is greater than the first threshold;
if yes, determining that the resistance state of the resistive random access memory cell has been switched correspondingly; and
if not, determining that the resistance state of the resistive random access memory cell is not switched correspondingly.

6. The method for determining the resistance state of the resistive random access memory cell according to claim 1, wherein the reset operations comprise a first type reset operation and a plurality of second type reset operations, and the step of performing the at least one of the reset operations and the set operation on the resistive random access memory cell and determining whether the resistance state of the resistive random access memory cell is switched correspondingly after experiencing at least one of the reset operations and set operation steps comprises:
when the current value of the cell current is between a third threshold and a fourth threshold, performing the first type reset operation on the resistive random access memory cell, wherein a reset voltage of the first type reset operation is lower than a reset voltage of the second type reset operations;
determining whether the current value of the cell current is higher than the second threshold after experiencing the first type reset operation, wherein the fourth threshold is greater than the third threshold, and the third threshold is greater than the second threshold, and the second threshold is greater than the first threshold;
if yes, determining that the resistance state of the resistive random access memory cell is not switched correspondingly.

7. The method for determining the resistance state of the resistive random access memory cell according to claim 6, wherein if the current value of the cell current is not higher than the second threshold after experiencing the first type reset operation, performing the second type of reset operations on the resistive random access memory cell, and determining whether the current value of the cell current is switched correspondingly to be lower than the first threshold after experiencing one of the second type reset operations;
if yes, determining that the resistance state of the resistive random access memory cell has been switched correspondingly;
if not, determining that the resistance state of the resistive random access memory cell is not switched correspondingly.

8. The method for determining the resistance state of the resistive random access memory cell according to claim 1, wherein the step of performing the recovery operation to restore the resistive random access memory cell comprising:
performing a specific reset operation on the resistive random access memory cell, wherein a reset voltage of the specific reset operation is higher than a reset voltage of the reset operations;
performing a forming operation on the resistive random access memory cell; and
performing another reset operation on the resistive random access memory cell, wherein the reset voltage of the other reset operation is lower than the reset voltage of the specific reset operation.

9. The method for determining the resistance state of the resistive random access memory cell according to claim 1, wherein a number of the reset operations is less than eight.

10. The method for determining the resistance state of the resistive random access memory cell according to claim 1, wherein when the current value of the cell current is greater than the first threshold, determining that the resistive random access memory cell is in the healthy state.

* * * * *